(12) United States Patent
Chien et al.

(10) Patent No.: US 12,725,653 B2
(45) Date of Patent: Sep. 1, 2026

(54) METHOD FOR OPERATING MEMORY DEVICE

(71) Applicant: MACRONIX INTERNATIONAL CO., LTD., Hsinchu (TW)

(72) Inventors: Wei-Chih Chien, New Taipei City (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 109 days.

(21) Appl. No.: 18/668,848

(22) Filed: May 20, 2024

(65) Prior Publication Data

US 2025/0239300 A1 Jul. 24, 2025

Related U.S. Application Data

(60) Provisional application No. 63/624,768, filed on Jan. 24, 2024.

(51) Int. Cl.
*G11C 13/00* (2006.01)
*H10B 99/00* (2023.01)

(52) U.S. Cl.
CPC ............ *G11C 13/00* (2013.01); *H10B 99/10* (2023.02)

(58) Field of Classification Search
CPC ..... G11C 13/00; G11C 13/0069; G11C 15/04; G11C 11/2257; G11C 11/2273; G11C 11/2275; G11C 13/0002; H10B 99/10
See application file for complete search history.

(56) References Cited

U.S. PATENT DOCUMENTS 8,699,255 B2 * 4/2014 Yu ........................ G11C 11/4097 365/230.03
9,312,002 B2 * 4/2016 Navon ............... G11C 13/0069
(Continued)

FOREIGN PATENT DOCUMENTS

TW 200849244 A 12/2008
TW 201106359 A 2/2011
(Continued)

OTHER PUBLICATIONS

Yoo, et al.: "Structural and Device Considerations for Vertical Cross Point Memory with Single-stack Memory toward CXL Memory beyond 1x nm 3DXP"; copyright 2022 IEEE; pp. 17-30.

*Primary Examiner* — Han Yang
(74) *Attorney, Agent, or Firm* — McClure, Qualey & Rodack, LLP

(57) ABSTRACT

A method for operating a memory device includes following steps. A memory device including a plurality of first electrodes, a plurality of second electrodes and a plurality of memory layers is provided, and a plurality of memory cells are formed at intersections between the first electrodes, the second electrodes and the memory layers. A selected memory cell is selected in the memory cells. −⅔ V is applied to a selected second electrode in the second electrodes, and the selected second electrode is in electrical contact with the selected memory cell. ⅓ V is applied to a selected first electrode in the first electrodes, and the selected first electrode is in electrical contact with the selected memory cell. 0 V is applied to unselected second electrodes in the second electrodes. 0 V is applied to unselected first electrodes in the first electrodes.

12 Claims, 6 Drawing Sheets

(56) References Cited

U.S. PATENT DOCUMENTS

| | | | | |
|---|---|---|---|---|
| 9,947,399 | B2 * | 4/2018 | Navon | G06F 11/1048 |
| 10,079,056 | B2 * | 9/2018 | Gupta | G11C 11/419 |
| 11,688,436 | B2 * | 6/2023 | Lin | G11C 7/12 365/207 |
| 2006/0056225 | A1 * | 3/2006 | Hashimoto | G11C 11/22 365/145 |
| 2011/0302354 | A1 * | 12/2011 | Miller | G11C 16/22 711/E12.001 |
| 2013/0135925 | A1 * | 5/2013 | Scheuerlein | G11C 13/0069 365/163 |
| 2014/0211557 | A1 | 7/2014 | Ong | |
| 2017/0092371 | A1 | 3/2017 | Harari | |
| 2018/0233204 | A1 | 8/2018 | Lee | |
| 2019/0221267 | A1 | 7/2019 | Ko | |

FOREIGN PATENT DOCUMENTS

| | | | |
|---|---|---|---|
| TW | 201519245 | A | 5/2015 |
| TW | 202139074 | A | 10/2021 |
| TW | 202310429 | A | 3/2023 |
| TW | 202339211 | A | 10/2023 |

* cited by examiner

METHOD FOR OPERATING MEMORY DEVICE

This application claims the benefit of U.S. provisional application Ser. No. 63/624,768, filed Jan. 24, 2024, the subject matter of which is incorporated herein by reference.

BACKGROUND OF THE INVENTION

Field of the Invention

The invention relates in general to a semiconductor device, and more particularly to a memory device.

Description of the Related Art

Recently, the demand for three-dimensional memory devices has become higher and higher. One type of 3D memory device is, for example, a vertical three-dimensional ovonic threshold switch (3D OTS) memory. The vertical 3D OTS memory may include a plurality of memory cell arrays stacked vertically. However, the current method for operating the vertical 3D OTS memory still faces some electrical problems (such as leakage current).

SUMMARY OF THE INVENTION

The present invention relates to a method for operating a memory device, and problems of leakage current can be improved.

According to an embodiment of the present invention, a method for operating a memory device is provided. The method includes following steps. A memory device including a plurality of first electrodes, a plurality of second electrodes and a plurality of memory layers is provided. The first electrodes are stacked along a first direction. The second electrodes penetrate through the first electrodes along the first direction. The memory layers are disposed between the first electrodes and the second electrodes, and the memory layers surround the second electrodes. A plurality of memory cells are formed at intersections between the first electrodes, the second electrodes and the memory layers. A selected memory cell is selected in the memory cells. −⅔ V is applied to a selected second electrode in the second electrodes, and the selected second electrode is in electrical contact with the selected memory cell. ⅓ V is applied to a selected first electrode in the first electrodes, and the selected first electrode is in electrical contact with the selected memory cell. 0 V is applied to unselected second electrodes in the second electrodes. 0 V is applied to unselected first electrodes in the first electrodes.

According to another embodiment of the present invention, a method for operating a memory device is provided. The method includes following steps. A memory device including a plurality of first electrodes, a plurality of second electrodes and a plurality of memory layers is provided. The first electrodes are stacked along a first direction. The second electrodes penetrate through the first electrodes along the first direction. The memory layers are disposed between the first electrodes and the second electrodes, and the memory layers surround the second electrodes. A plurality of memory cells are formed at intersections between the first electrodes, the second electrodes and the memory layers. A selected memory cell is selected in the memory cells. ⅔ V is applied to a selected second electrode in the second electrodes, and the selected second electrode is in electrical contact with the selected memory cell. −⅓ V is applied to a selected first electrode in the first electrodes, and the selected first electrode is in electrical contact with the selected memory cell. 0 V is applied to unselected second electrodes in the second electrodes. 0 V is applied to unselected first electrodes in the first electrodes.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
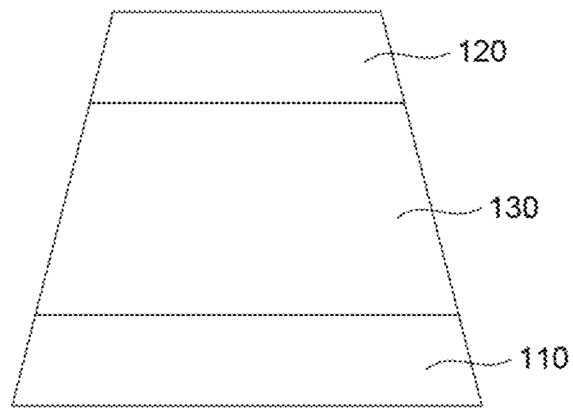
FIG. 1 is a side view of a memory device according to an embodiment of the present invention.

The following are related embodiments, together with the drawings, to describe the memory structure provided by the present invention in detail. However, the present invention is not limited thereto. The descriptions in the embodiments, such as the detailed structure, the operating method, and the material application, etc., are only for the purpose of illustration, and the scope of protection of the present invention is not limited to the mentioned implementation aspects.

At the same time, it should be noted that this disclosure does not show all possible embodiments. One of ordinary skilled in the art can make changes and modifications to the structures and operating methods of the embodiments to meet the needs of practical applications without departing from the spirit and scope of the present disclosure. Therefore, other implementation aspects not proposed in the present disclosure may also be applicable. Furthermore, the drawings are simplified for the purpose of clearly explaining the contents of the embodiments, and the dimension and ratios in the drawings are not drawn according to the actual product scale. Therefore, the description and the drawings are only used to describe the embodiments, rather than to limit the protection scope of the present disclosure. The same or similar reference numerals are used to represent the same or similar elements.

FIG. 1 is a side view of a memory device 10 according to an embodiment of the present invention. Referring to FIG. 1, the memory device 10 includes a first electrode 110, a second electrode 120 and a memory layer 130 disposed between the first electrode 110 and the second electrode 120. The memory layer 130 includes a composition including X wt % Cu (i.e. Copper), Y wt % Ge (i.e. Germanium) and Z wt % Se (i.e. Selenium). X ranges between 3.33 and 26.66. Y ranges between 28.33 and 86.66. Z ranges between 10 and 45. X+Y+Z=100 (around 100, such as 99.99). Moreover, the composition of the memory layer 130 includes GeSe, Ge and $Cu_2GeSe_3$.

According to an embodiment, the composition of the memory layer 130 includes 10 wt % GeSe, 10 wt % Ge and 80 wt % $Cu_2GeSe_3$. That is, X=26.66, Y=28.33 and Z=45. The atomic percentage (at %) ratio of the composition of the memory layer 130 including copper, selenium and germanium is 1:4:5 (i.e. Cu:Se:Ge=1:4:5).

According to an embodiment, the composition of the memory layer 130 includes 80 wt % GeSe, 10 wt % Ge and 10 wt % $Cu_2GeSe_3$. That is, X=3.33, Y=51.66 and Z=45.

According to an embodiment, the composition of the memory layer 130 includes 10 wt % GeSe, 80 wt % Ge and 10 wt % $Cu_2GeSe_3$. That is, X=3.33, Y=86.66 and Z=10.

According to an embodiment, the composition of the memory layer 130 includes 50 wt % GeSe, 20 wt % Ge and 30 wt % $Cu_2GeSe_3$.

According to an embodiment, the composition of the memory layer 130 further includes GeAsSe.

According to an embodiment, the composition of the memory layer 130 further includes In doped GeAsSe.

According to an embodiment, the composition of the memory layer 130 further includes Si doped GeAsSe.

According to some embodiments, the materials of the first electrode 110 and the second electrode 120 may include a conductive material, and the conductive material is titanium nitride (TiN), carbon (C), tungsten (W), titanium (Ti), nickel (Ni), cobalt (Co), polysilicon or other suitable conductive material. The materials of the first electrode 110 and the second electrode 120 may be the same or different.

In the present embodiment, the memory layer 130 contacts the first electrode 110 and the second electrode 120. That is, there are no other layers between the memory layer 130 and the first electrode 110 and between the memory layer 130 and the second electrode 120. The memory layer 130 does not include phase change memory materials and barrier layers.

According to some embodiments, the memory device 10 can be performed in the forward and reverse program operations and read operations. Since the memory layer 130 of the memory device 10 of the present application can be used as a switching element and a memory element, the memory device 10 does not need to include phase change memory materials, and the barrier layers disposed between the phase change memory material and the switching layer (such as OTS) can also be omitted.

Figure 2:
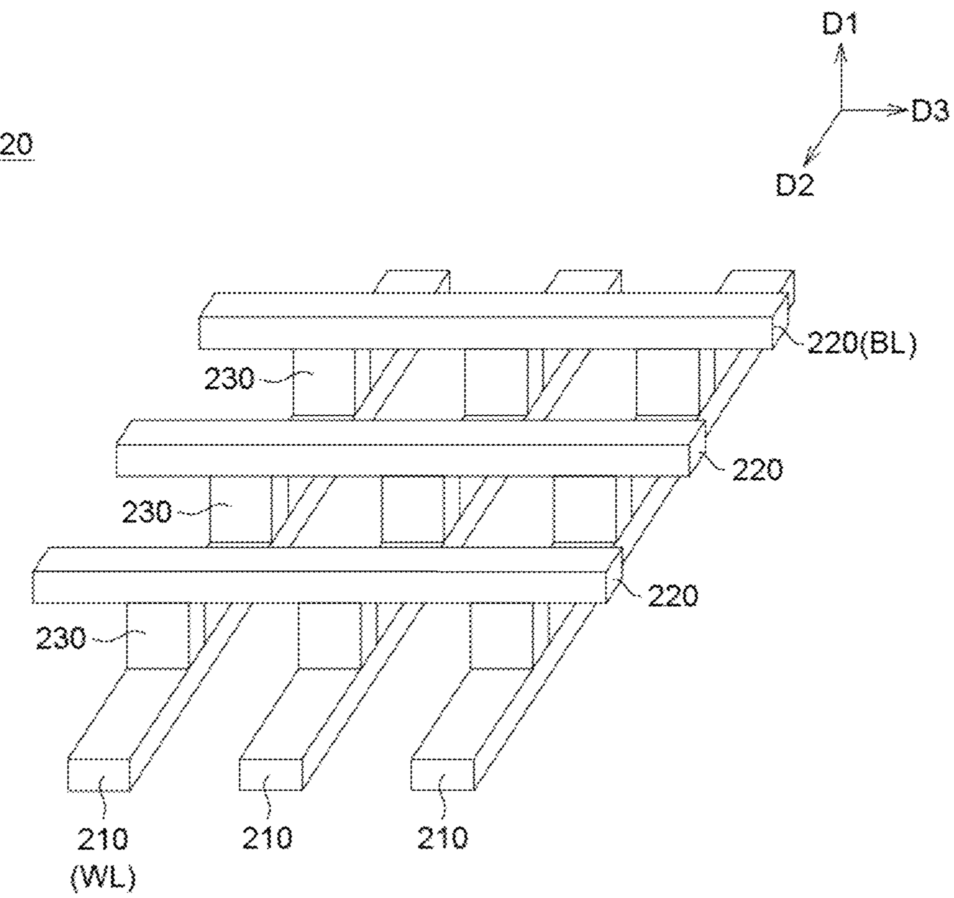
FIG. 2 is a three-dimensional view of a memory device according to another embodiment of the present invention.

FIG. 2 is a three-dimensional view of a memory device 20 according to another embodiment of the present invention. The memory device 20 is, for example, a three-dimensional cross-point memory (3D cross-point memory, 3DXpoint). The elements in the memory device 20 which are the same or similar to the elements in the memory device 10 is designated as the same or similar reference numerals. The same or similar elements between the memory device 20 and the memory device 10 have the same or similar materials and functions. This will not be described in detail.

The memory device 20 includes a plurality of first electrodes 210, a plurality of second electrodes 220 and a plurality of memory layers 230. The first electrode 210, the memory layers 230 and the second electrodes 220 are stacked along a first direction D1. The extension direction of the first electrodes 210 is different from the extension direction of the second electrodes 220. Each of the first electrodes 210 extends along the second direction D2. Each of the second electrodes 220 extends along the third direction D3, and the first direction D1, the second direction D2, and the third direction D3 may be perpendicular to each other (the present invention is not limited thereto). That is, the extension direction of the first electrodes 210 is different from the extension direction of the second electrodes 220. The memory layers 230 are formed at the intersections between the first electrodes 210 and the second electrodes 220. The first electrodes 210 can respectively serve as a word line WL, and the second electrodes 220 can respectively serve as a bit line BL.

In some embodiment, the memory device 20 further includes a plurality of first barrier layers (not shown) and a plurality of second barrier layers (not shown). The first barrier layers (not shown) are disposed between the first electrodes 210 and the memory layers 230, and the second barrier layers (not shown) are disposed between the second electrodes 220 and the memory layers 230.

Similarly, the memory device 20 of the present invention is suitable for bipolar operation. Since the memory layer 230 of the memory device 20 in the present invention can be used as a switching element and a memory element, the memory device 20 does not need to include phase change memory materials.

Figure 3:
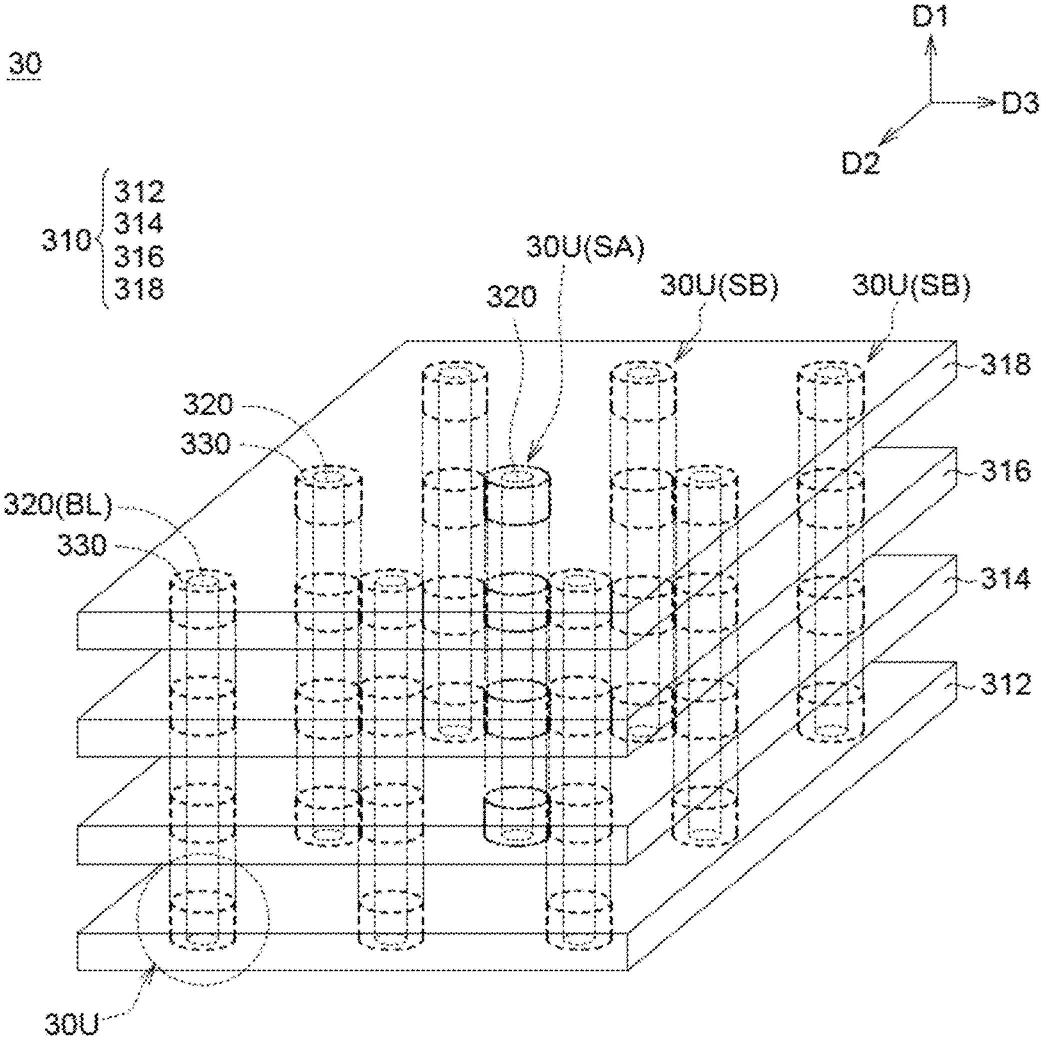
FIG. 3 is a three-dimensional view of a memory device according to a further embodiment of the present invention.

FIG. 3 shows a three-dimensional view of a memory device 30 according to a further embodiment of the present invention. The memory device 30 is, for example, a 3D vertical memory (3DVM). The elements in the memory device 30 which are the same or similar to the elements in the memory device 10 is designated as the same or similar reference numerals. The same or similar elements between the memory device 30 and the memory device 10 have the same or similar materials and functions. This will not be described in detail.

Referring to FIG. 3, the memory device 30 includes a plurality of first electrodes 310, a plurality of second electrodes 320 and a plurality of memory layers 330. The first electrodes 310 are stacked along the first direction D1, and each of the first electrodes 310 is, for example, a layer extending along the second direction D2 and the third direction D3. In the present embodiment, the first electrodes 310 have four layers. However, the amount of first electrodes in the memory device of the present invention is not limited thereto. For example, the amount of first electrodes may be greater than four. The second electrodes 320 respectively pass through the first electrodes 310 along the first direction D1, and the memory layers 230 surround the second electrodes 320. Each of the second electrodes 320 is, for example, a columnar structure extending along the first direction D1. It should be understood that the amount of second electrodes of the memory device of the present invention is not limited to the amount of second electrodes 320 shown in FIG. 3. In some embodiments, the amount of second electrodes of the memory device may be 1000×1000, 512×512, 256×256 or other suitable amount. Each of the memory layers 330 is, for example, a hollow columnar structure extending along the first direction D1. Each of intersections of the first electrodes 310, the second electrodes 320 and the memory layers 330 may correspond to a memory cell 30U.

According to some embodiments, the first electrodes 310 can respectively serve as a word line WL, and the second electrodes 320 can respectively serve as a bit line BL. The desired memory cell 30U can be selected by applying voltages to the first electrodes 310 and the second electrodes 320.

Similarly, the memory device 30 of the present invention is suitable for bipolar operation. Since the memory layer 330 of the memory device 30 in the present application can be used as a switching element and a memory element, the memory device 30 does not need to include phase change memory materials.

Table 1 below shows some operating methods of a three-dimensional vertical memory (3DVM) (e.g., memory device 30).

TABLE 1

| groups | Selected second electrode | Selected first electrode | Unselected second electrodes | Unselected first electrodes |
|---|---|---|---|---|
| Comparison example A1 | −1/2 V | 1/2 V | 0 V | 0 V |
| Comparison example B1 | 1/2 V | −1/2 V | 0 V | 0 V |
| Comparison example A2 | −2/3 V | 1/3 V | 0 V | −1/3 V |
| Comparison example B2 | 2/3 V | −1/3 V | 0 V | 1/3 V |
| Embodiment A | −2/3 V | 1/3 V | 0 V | 0 V |
| Embodiment B | 2/3 V | −1/3 V | 0 V | 0 V |

The memory device 30 is specifically mentioned below to facilitate understanding the Comparison example A1 to Embodiment B in Table 1. However, the operation method shown in Table 1 is not limited to application to the memory device 30, but can be applied to all three-dimensional vertical memories according to the present invention. Please refer to FIG. 3 and Table 1 at the same time. The method for operating the memory device 30 may include the following steps. Firstly, a memory device 30 is provided. Secondly, a selected memory cell SA is selected in the memory cells 30U in the memory device 30. The memory cells 30U other than the selected memory cell SA are called as unselected memory cells SB. The second electrode which is in electrical contact with the selected memory cell SA is called as "selected second electrode", and the second electrodes 320 that are not in electrical contact with the selected memory cell SA are called as "unselected second electrodes." The first electrode 310 that is in electrical contact with the selected memory cell SA is called as "selected first electrode", and the first electrodes 310 that are not in electrical contact with the selected memory cell SA are called as "unselected first electrodes". Thereafter, different operating voltages are applied to the first electrodes 310 and the second electrodes (detailed below).

In Table 1, Comparison examples A1 and B1 are typical ½ V schemes (half-V scheme), Comparison example A1 is a reverse operation, and Comparison example B1 is a forward operation.

As shown in Table 1, according to Comparison Example A1, the method for operating the memory device 30 is as follows: applying −½ V to a selected second electrode 320 (in electrical contact with the selected memory cell SA) in the second electrodes 320; applying ½ V to a selected first electrode 318 (in electrical contact with the selected memory cell SA) in the first electrodes 310; applying 0 V to unselected second electrodes 320 (not in electrical contact with the selected memory cell SA) in the second electrodes 320; and applying 0 V to unselected first electrodes 312-316 (not in electrical contact with the selected memory cell SA) in the first electrodes 310. It should be understood that the above steps do not need to be performed in order.

As shown in Table 1, according to Comparison Example B1, the method for operating the memory device 30 is as follows: applying ½ V to a selected second electrode 320 (in electrical contact with the selected memory cell SA) in the second electrodes 320; applying −½ V to a selected first electrode 318 (in electrical contact with the selected memory cell SA) in the first electrodes 310; applying 0 V to unselected second electrodes 320 (not in electrical contact with the selected memory cell SA) in the second electrodes 320; and applying 0 V to unselected first electrodes 312-316 (not in electrical contact with the selected memory cell SA) in the first electrodes 310. It should be understood that the above steps do not need to be performed in order.

In Table 1, Comparison examples A2 and B2 are typical ⅓ V schemes, Comparison example A2 is a reverse operation, and Comparison example B2 is a forward operation.

As shown in Table 1, according to Comparison Example A2, the method for operating the memory device 30 is as follows: applying −⅔ V to a selected second electrode 320 (in electrical contact with the selected memory cell SA) in the second electrodes 320; applying ⅓ V to a selected first electrode 318 (in electrical contact with the selected memory cell SA) in the first electrodes 310; applying −⅓ V to unselected second electrodes 320 (not in electrical contact with the selected memory cell SA) in the second electrodes 320; and applying 0 V to unselected first electrodes 312-316 (not in electrical contact with the selected memory cell SA) in the first electrodes 310. It should be understood that the above steps do not need to be performed in order.

As shown in Table 1, according to Comparison Example B2, the method for operating the memory device 30 is as follows: applying ⅔ V to a selected second electrode 320 (in electrical contact with the selected memory cell SA) in the second electrodes 320; applying −⅓ V to a selected first electrode 318 (in electrical contact with the selected memory cell SA) in the first electrodes 310; applying 0 V to an unselected second electrode in the second electrodes 320 (not in electrical contact with the selected memory cell SA); and applying ⅓ V to unselected first electrodes 312-316 (not in electrical contact with the selected memory cell SA) in the first electrodes 310. It should be understood that the above steps do not need to be performed in order.

In Table 1, Embodiment A and Embodiment B are modified ⅓ V schemes, Embodiment A is a reverse operation, and Embodiment B is a forward operation.

As shown in Table 1, according to Embodiment A, the method for operating the memory device 30 is as follows: applying −⅔ V to a selected second electrode 320 (in electrical contact with the selected memory cell SA) in the second electrodes 320; applying ⅓ V to a selected first electrode 318 (in electrical contact with the selected memory cell SA) in the first electrodes 310; applying 0 V to unselected second electrodes 320 (not in electrical contact with the selected memory cell SA) in the second electrodes 320; and applying 0 V to unselected first electrodes 312-316 (not in electrical contact with the selected memory cell SA) in the first electrodes 310. It should be understood that the above steps do not need to be performed in order.

As shown in Table 1, according to Embodiment B, the method for operating the memory device 30 is as follows: applying ⅔ V to a selected second electrode 320 (in electrical contact with the selected memory cell SA) in the second electrodes 320; applying −⅓ V to a selected first electrode 318 (in electrical contact with the selected memory cell SA) in the first electrodes 310; applying 0 V to an unselected second electrode in the second electrodes 320 (not in electrical contact with the selected memory cell SA); and applying 0 V to unselected first electrodes 312-316 (not in electrical contact with the selected memory cell SA) in the first electrodes 310. It should be understood that the above steps do not need to be performed in order.

In Table 1, the unit of "V" is volt, and "V" can represent the program voltage or the read voltage. That is, the methods for operating the memory device according to Embodiments A and B of the present invention can be used to perform a program operation or a read operation. For example, when a program operation is performed, the programming voltage is 6 V. According to Embodiment A, the method for operating the memory device 30 is as follows: applying −4 V (i.e., 6×(−⅔)=−4) to a selected second electrode 320 (in electrical contact with the selected memory cell SA) in the second electrodes 320; applying 2 V to a selected first electrode 318 (in electrical contact with the selected memory cell SA) in the first electrodes 310; applying 0 V to an unselected second electrode in the second electrodes 320 (not in electrical contact with the selected memory cell SA); and applying 0 V to unselected first electrodes 312-316 (not in electrical contact with the selected memory cell SA) in the first electrodes 310. It should be understood that the above steps do not need to be performed in order.

Figure 4:
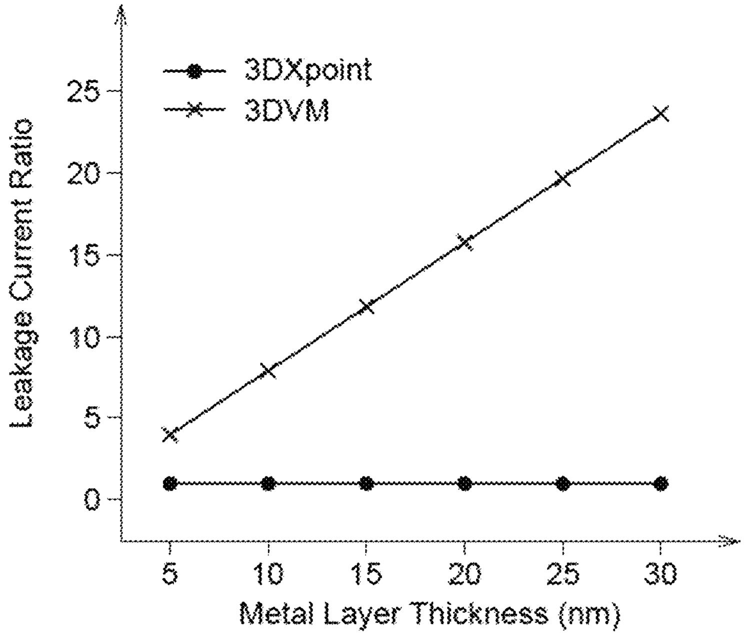
FIG. 4 shows a comparison of the leakage current between a 3D cross-point memory and a 3D vertical memory.

FIG. 4 shows a comparison of the leakage current between a 3D cross-point memory (3DXpoint) (such as the memory device 20) and a 3D vertical memory (3DVM) (such as the memory device 30). The X-axis represents the thickness of the metal layer (nm), and the Y-axis represents the ratio of leakage current.

Please refer to FIGS. 2-3 at the same time. The metal layer thickness of the memory device 20 (for example, the total thickness of the first electrode 210 and the second electrode 220 in the first direction D1) is smaller than the metal layer thickness of the memory device 30 (for example, the total thickness of the first electrode 310 and the second electrode 320 in the first direction D1). In other words, the metal layer thickness of the three-dimensional vertical memory (3DVM) is greater than the metal layer thickness of the three-dimensional cross-point memory (3DXpoint), and as the amount of first electrodes (210 or 310) and second electrodes (220 or 320) increases, the metal layer thickness will become larger and larger.

As shown in FIG. 4, the leakage current of the three-dimensional cross-point memory 3DXpoint is smaller than the leakage current of the three-dimensional vertical memory 3DVM, and as the thickness of the metal layer of the three-dimensional vertical memory 3DVM becomes higher and higher, the leakage current becomes higher and higher.

Figure 5:
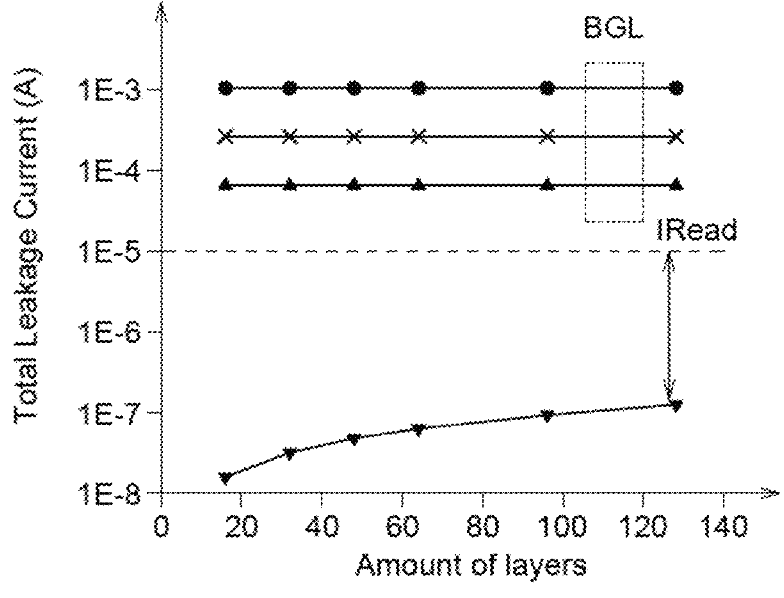
FIG. 5 is a schematic diagram illustrating the estimated leakage current of the 3D vertical memory of the present invention operating according to a typical ½ V scheme.

FIG. 5 is a schematic diagram illustrating the estimated leakage current of the 3D vertical memory 3DVM of the present invention operating according to a typical ½ V scheme, assuming that the leakage current of each memory cell is 1 nA. The X-axis represents the amount of metal layers of the three-dimensional vertical memory 3DVM (e.g., the amount of first electrodes 310 in the memory device 30). The Y-axis represents the total leakage current (A).

Comparison Example C1 shows that the amount of conductive pillars (corresponding to the second electrodes 320 in the memory device 30) of the three-dimensional vertical memory 3DVM is 1000×1000. Comparison Example C2 shows that the amount of conductive pillars (corresponding to the second electrodes 320 in the memory device 30) of the three-dimensional vertical memory 3DVM is 512×512. Comparison Example C3 shows that the amount of conductive pillars (corresponding to the second electrodes 320 in the memory device 30) of the three-dimensional vertical memory 3DVM is 256×256. Comparison Example C4 shows the read leakage current of the selected memory cell (corresponding to the memory cell SA in the memory device 30) of the three-dimensional vertical memory 3DVM.

As shown in FIG. 5, the leakage current in Comparison Example C2 is greater than the leakage current in Comparison Example C3, and the leakage current in Comparison Example C1 is greater than the leakage current in Comparison Example C2. It can be seen that as the amount of conductive pillars (corresponding to the second electrodes 320 in the memory device 30) of the three-dimensional vertical memory 3DVM increases, the leakage current will become larger and larger. Comparison Example C4 shows that the selected memory cell of the three-dimensional vertical memory 3DVM (corresponding to the memory cell SA in the memory device 30) has a small read leakage current which is different from the read current IRead, as shown by the double arrow, indicating that the read window is good.

However, Comparison Examples C1-C3 have very high background leakage BGL, as shown in FIG. 5.

Figure 6:
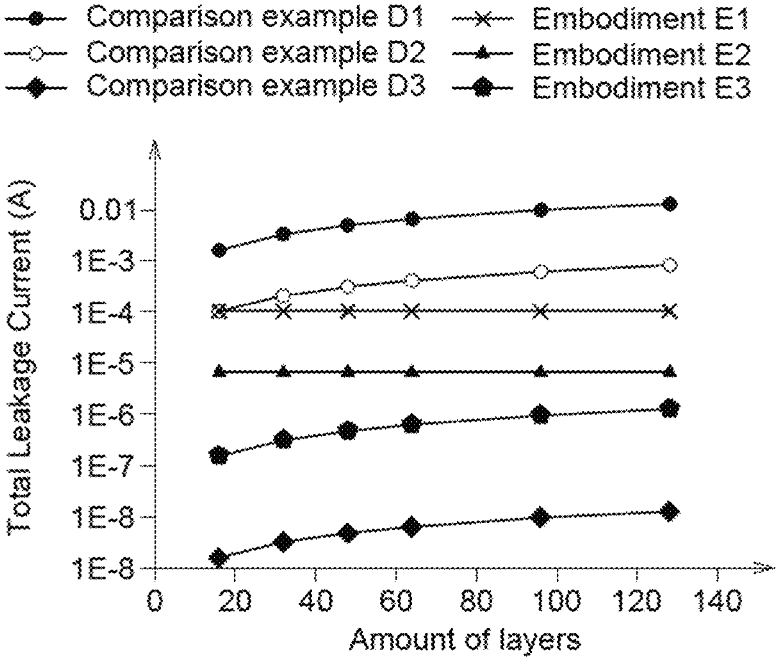
FIG. 6 is a schematic diagram illustrating the estimated leakage current of the 3D vertical memory of the present invention operating according to a typical ⅓ V scheme and a modified ⅓ V scheme.

FIG. 6 is a schematic diagram illustrating the estimated of leakage current of the three-dimensional vertical memory 3DVM of the present invention according to a typical ⅓ V scheme and a modified ⅓ V scheme, assuming that the leakage current of each memory cell is 1 nA. The X-axis represents the amount of metal layers of the three-dimensional vertical memory 3DVM (e.g., the amount of first electrodes 310 in the memory device 30). The Y-axis represents the total leakage current (A).

In FIG. 6, Comparison Example D1 represents a three-dimensional vertical memory 3DVM with an amount of 1000×1000 conductive pillars (corresponding to the second electrodes 320 in the memory device 30) operated by using a typical ⅓ V scheme; Comparison Example D2 represents a three-dimensional vertical memory 3DVM with an amount of 256×256 conductive pillars (corresponding to the second electrodes 320 in the memory device 30) operated by using a typical ⅓ V scheme; Comparison Example D3 represents the read leakage current of a three-dimensional vertical memory 3DVM operated by using a typical ⅓ V scheme; Embodiment E1 represents a three-dimensional vertical memory 3DVM with an amount of 1000×1000 conductive pillars (corresponding to the second electrodes 320 in the memory device 30) operated by using a modified ⅓ V scheme; Embodiment E2 represents a three-dimensional vertical memory 3DVM with an amount of 256×256 conductive pillars (corresponding to the second electrodes 320 in the memory device 30) operated by using a modified ⅓ V scheme; Embodiment D3 represents the read leakage current of a three-dimensional vertical memory 3DVM operated by using a modified ⅓ V scheme.

As shown in FIG. 6, Embodiment E1 has a smaller leakage current than the leakage current of Comparison Example D1, and Embodiment E2 has a smaller leakage current than the leakage current of Comparison Example D2. It can be seen that operating the three-dimensional vertical memory 3DVM according to the modified ⅓ V scheme of the present invention can indeed reduce the background leakage current and greatly improve the leakage current problem in the typical ⅓ V scheme.

As can be seen from the above contents, according to an embodiment of the present invention, a method for operating a memory device is proposed. The method includes following steps. A memory device including a plurality of first electrodes, a plurality of second electrodes and a plurality of memory layers is provided. The first electrodes are stacked along a first direction. The second electrodes penetrate through the first electrodes along the first direction. The memory layers are disposed between the first electrodes and the second electrodes, and the memory layers surround the second electrodes. A plurality of memory cells are formed at intersections between the first electrodes, the second electrodes and the memory layers. A selected memory cell is selected in the memory cells. −⅔ V is applied to a selected second electrode in the second electrodes, and the selected second electrode is in electrical contact with the selected memory cell. ⅓ V is applied to a selected first electrode in the first electrodes, and the selected first electrode is in electrical contact with the selected memory cell. 0 V is applied to unselected second electrodes in the second electrodes. 0 V is applied to unselected first electrodes in the first electrodes. Compared with comparison examples that use a typical ⅓ V scheme to operate a semiconductor device (as shown in Comparison examples A2 and B2 in Table 1), since the method for operating the memory device of the present invention is a modified ⅓ V scheme, the unselected first electrodes are applied with 0 V, so it can effectively improve the leakage current problem of the memory device. Even if the height of the three-dimensional memory is increased (that is, the metal layer increases), it can still have a lower leakage current, so the memory device can have good electrical characteristics, the reliability can be increased, the performance of the memory device can be improved and the power consumption can be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a memory device, comprising:

providing a memory device, wherein the memory device comprises:

a plurality of first electrodes stacked along a first direction;

a plurality of second electrodes penetrating through the first electrodes along the first direction; and a plurality of memory layers disposed between the first electrodes and the second electrodes, and the memory layers surrounding the second electrodes, wherein a plurality of memory cells are formed at intersections between the first electrodes, the second electrodes and the memory layers;

selecting a selected memory cell in the memory cells;

applying −⅔ V to a selected second electrode in the second electrodes, wherein the selected second electrode is in electrical contact with the selected memory cell;

applying ⅓ V to a selected first electrode in the first electrodes, wherein the selected first electrode is in electrical contact with the selected memory cell;

applying 0 V to unselected second electrodes in the second electrodes; and applying 0 V to unselected first electrodes in the first electrodes.

2. The method according to claim 1, wherein the method is used to perform a program operation or a read operation.

3. The memory device according to claim 1, wherein a composition of the memory layers comprises GeSe, Ge and $Cu_2GeSe_3$.

4. The memory device according to claim 3, wherein the composition of the memory layers further comprises GeAsSe.

5. The memory device according to claim 3, wherein the composition of the memory layers further comprises In doped GeAsSe.

6. The memory device according to claim 3, wherein the composition of the memory layers further comprises Si doped GeAsSe.

7. A method for operating a memory device, comprising:

providing a memory device, wherein the memory device comprises:

a plurality of first electrodes stacked along a first direction;

a plurality of second electrodes penetrating through the first electrodes along the first direction; and a plurality of memory layers disposed between the first electrodes and the second electrodes, and the memory layers surrounding the second electrodes, wherein a plurality of memory cells are formed at intersections between the first electrodes, the second electrodes and the memory layers;

selecting a selected memory cell in the memory cells;

applying ⅔ V to a selected second electrode in the second electrodes, wherein the selected second electrode is in electrical contact with the selected memory cell;

applying −⅓ V to a selected first electrode in the first electrodes, wherein the selected first electrode is in electrical contact with the selected memory cell;

applying 0 V to unselected second electrodes in the second electrodes; and applying 0 V to unselected first electrodes in the first electrodes.

8. The method according to claim 7, wherein the method is used to perform a program operation or a read operation.

9. The memory device according to claim 7, wherein a composition of the memory layers comprises GeSe, Ge and $Cu_2GeSe_3$.

10. The memory device according to claim 9, wherein the composition of the memory layers further comprises GeAsSe.

11. The memory device according to claim 9, wherein the composition of the memory layers further comprises In doped GeAsSe.

12. The memory device according to claim 9, wherein the composition of the memory layers further comprises Si doped GeAsSe.

* * * * *